(12) United States Patent
Semanson et al.

(10) Patent No.: US 11,163,402 B1
(45) Date of Patent: Nov. 2, 2021

(54) MUTUAL CAPACITIVE TOUCH SENSING ANOMALY DETECTION

(71) Applicant: Renesas Electronics Corporation, Tokyo (JP)

(72) Inventors: Christopher Semanson, Durham, NC (US); Onkar Raut, Sunnyvale, CA (US); James Page, Hillsborough, NC (US)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/215,112

(22) Filed: Mar. 29, 2021

(51) Int. Cl.
*G06F 3/041* (2006.01)
*G06F 3/044* (2006.01)

(52) U.S. Cl.
CPC ............ *G06F 3/0418* (2013.01); *G06F 3/044* (2013.01)

(58) Field of Classification Search
None
See application file for complete search history.

(56) References Cited

U.S. PATENT DOCUMENTS

2019/0370652 A1* 12/2019 Shen ................ G06F 17/14

* cited by examiner

*Primary Examiner* — Stephen T. Reed
(74) *Attorney, Agent, or Firm* — Scully, Scott, Murphy & Presser, P.C.

(57) ABSTRACT

Systems and methods for determining a likelihood of an occurrence of an anomaly in a sensor are described. A processor can receive a first measurement of a first capacitance change between a first port and a second port of a device connected to the sensor. The first measurement can be obtained in response to the first port being configured to perform a first function, and in response to the second port being configured to perform a second function. The processor can receive a second measurement of a second capacitance change between the first and second ports. The second measurement can be obtained in response to the first port being configured to perform the second function, and in response to the second port being configured to perform the first function. The processor can determine the likelihood of the occurrence of the anomaly based on the first and second measurements.

20 Claims, 6 Drawing Sheets

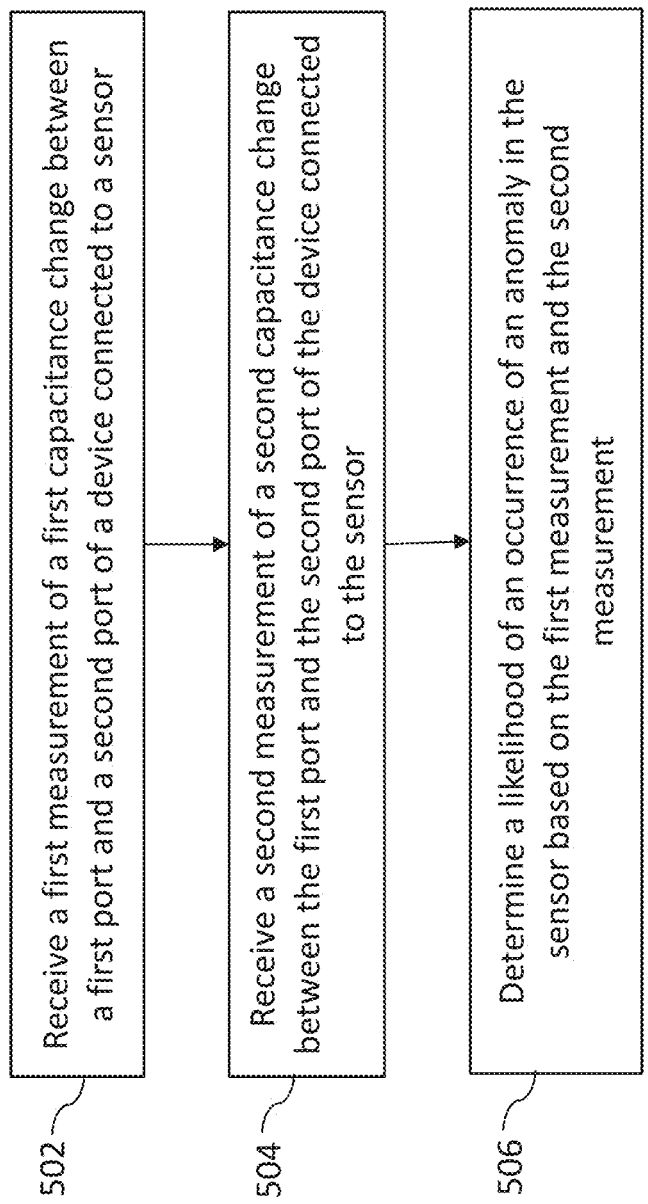

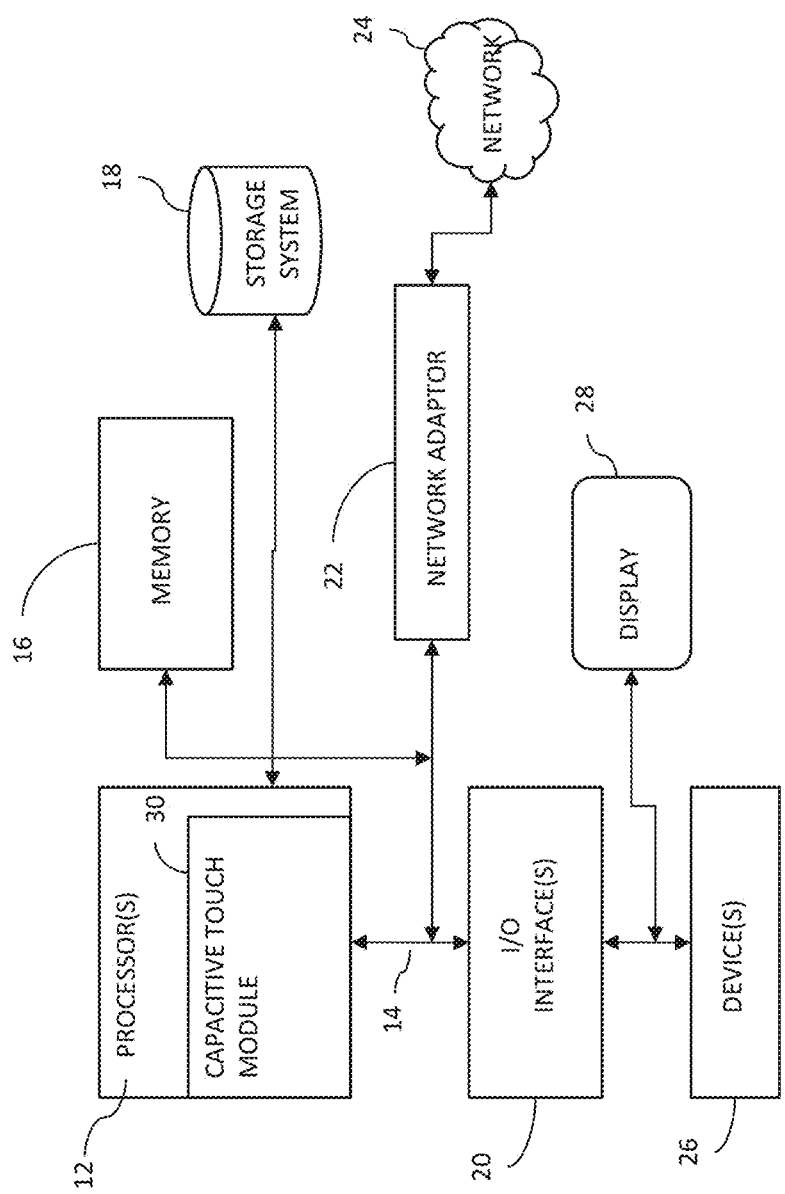

MUTUAL CAPACITIVE TOUCH SENSING ANOMALY DETECTION

BACKGROUND

The present disclosure relates in general to systems and methods for detecting anomaly in devices and applications that utilizes mutual capacitive touch sensing.

Capacitive touch technology can be utilized for a user interface (e.g., human machine interface (HMI)) that can be manipulated with motions or gestures caused by an object, such as a touch of a finger or a quantity selected by a movement on the user interface (e.g., a swipe). Capacitive touch technology can include mutual capacitance detection, where a capacitive element can be formed by two conductive elements that can generate an electric field. The mutual capacitance between the two conductive elements forming the capacitive element can change (e.g., reduce) in response to an object being in proximity to the capacitive element to change the electric field. The reduction of mutual capacitance can be detected as a touch event on the user interface.

SUMMARY

In some examples, an apparatus for determining a likelihood of an occurrence of an anomaly in a sensor is generally described. The apparatus can include a processor. The processor can be configured to receive a first measurement of a first capacitance change between a first port and a second port. The first port and the second port can be ports of a device connected to a sensor. The first measurement can be obtained in response to the first port being configured to perform a first function, and in response to the second port being configured to perform a second function. The processor can be further configured to receive a second measurement of a second capacitance change between the first port and the second port. The second measurement can be obtained in response to the first port being configured to perform the second function, and in response to the second port being configured to perform the first function. The processor can be further configured to determine a likelihood of an occurrence of an anomaly in the sensor based on the first measurement and the second measurement.

In some examples, a method for determining a likelihood of an occurrence of an anomaly in a sensor is generally described. The method can include receiving, by a processor, a first measurement of a first capacitance change between a first port and a second port of a device connected to a sensor. The first measurement can be obtained in response to the first port being configured to perform a first function, and in response to the second port being configured to perform a second function. The method can further include receiving, by the processor, a second measurement of a second capacitance change between the first port and the second port. The second measurement can be obtained in response to the first port being configured to perform the second function, and in response to the second port being configured to perform the first function. The method can further include determining, by the processor, a likelihood of an occurrence of an anomaly in the sensor based on the first measurement and the second measurement.

In some examples, a non-transitory computer-readable storage medium for determining a likelihood of an occurrence of an anomaly in a sensor is generally described. The non-transitory computer-readable storage medium can store instructions that cause a computer to perform receiving, a first measurement of a first capacitance change between a first port and a second port of a device connected to a sensor. The first measurement can be obtained in response to the first port being configured to perform a first function, and in response to the second port being configured to perform a second function. The instructions can further cause the computer to perform receiving a second measurement of a second capacitance change between the first port and the second port of the device connected to the sensor. The second measurement can be obtained in response to the first port being configured to perform the second function, and in response to the second port being configured to perform the first function. The instructions can further cause the computer to perform determining a likelihood of an occurrence of an anomaly in the sensor based on the first measurement and the second measurement.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 5 is a flow diagram illustrating a process of implementing mutual capacitive touch sensing anomaly detection in one embodiment.

FIG. 6 illustrates a schematic of an example computer or processing system relating to mutual capacitive touch sensing anomaly detection in one embodiment.

DETAILED DESCRIPTION

In some examples, to determine whether there is an error or other types of anomaly in a mutual capacitive touch sensor, a threshold-based system can be used for continuously monitoring the electric field created on the sensor. For example, a comparison of a mutual capacitance change with a threshold can determine whether there is a touch event, but the result does not indicate whether the touch event is a false positive (e.g., unintentional touch of a button). Further, in some instances, the mutual capacitance change can remain the same as normal operation even when a trace connected to the sensor is damaged because the capacitance change, and not the capacitance itself, is being compared to the threshold. Therefore, a conventional threshold-based system may be insufficient to determine certain anomalies of the mutual capacitive touch sensor. Some other conventional approaches to identify errors include using a maximum touch difference between a reference line, utilizing an adjacent general purpose input/output (GPIO) to determine if the sensor is being actuated, taking up an existing GPIO port to determine if a trace is broken, or implementing two microcontrollers to measure the same sensor. However, these approaches still utilizes the same capacitive change and may require additional hardware.

Figure 1:
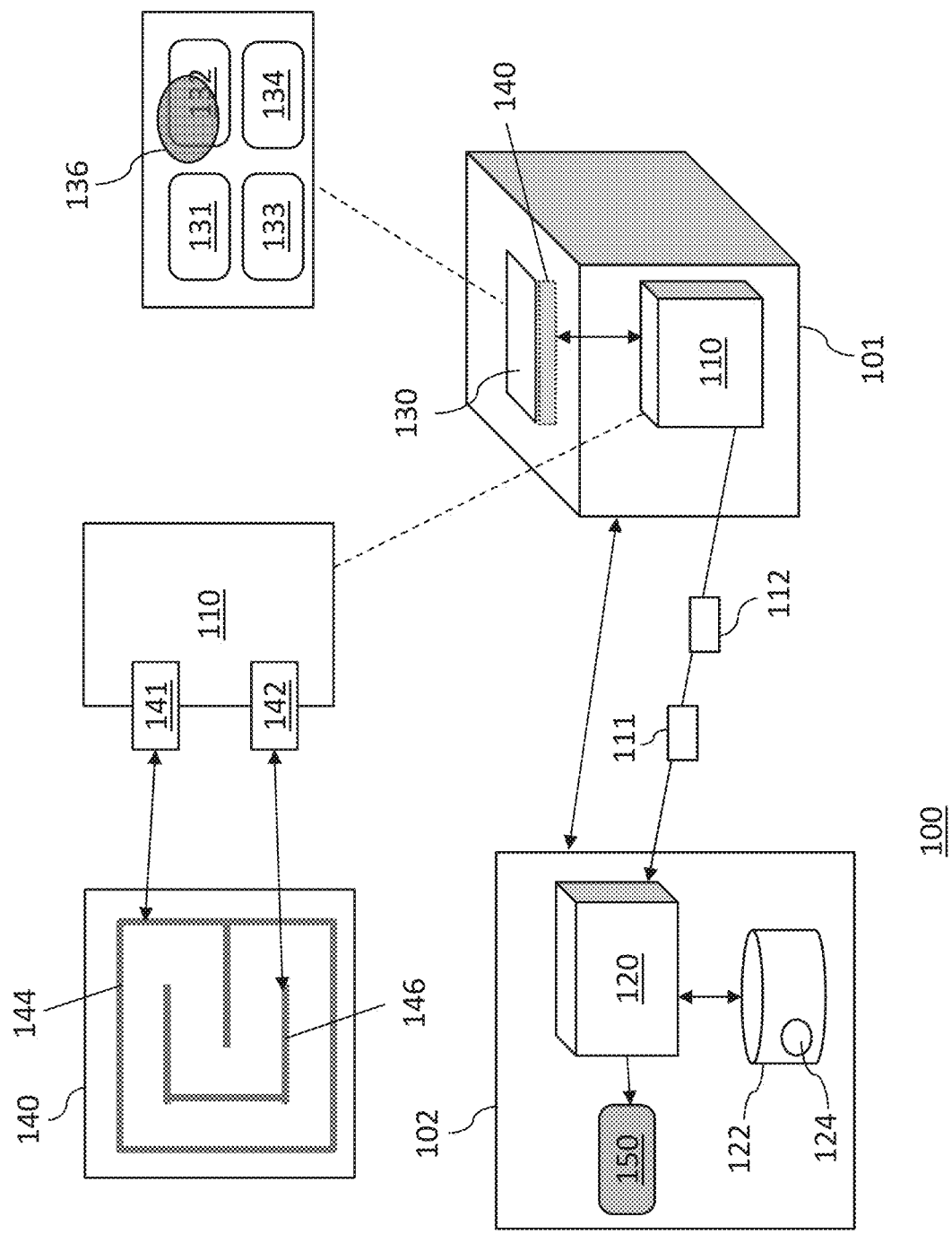
FIG. 1 is a diagram showing an example system that can implement mutual capacitive touch sensing anomaly detection in one embodiment.

FIG. 1 is a diagram showing an example system 100 that can implement mutual capacitive touch sensing anomaly detection in one embodiment. The system 100 can include an apparatus or equipment 101 and/or a computer device 102. The computer device 102 can include a processor 120 and a memory 122. The processor 120 can be configured to be in communication with the memory 122. The computer device 102 can be, for example, a desktop computer, a laptop computer, a server, a tablet device, and/or other types of computing devices. The computer device 102 can be configured to be in communication with the equipment 101 via a wired connection or a wireless connection. The memory 122 can be a memory device including memory units such as read-only memory (ROM), random access memory (RAM), registers, buffers, caches, etc. The memory 122 can be configured to store a set of instructions 124. The set of instructions 124 can include code, such as source code and/or executable code, that can be executed by the processor 120 to perform one or more tasks or functions to implement the system 100. In an example, the processor 120 can be configured to execute the set of instructions 124 to run one or more applications that can monitor the equipment 101, or that can perform various diagnostics on operating conditions or status of the equipment 101.

The equipment 101 can be, for example, an appliance, a white goods product, a healthcare device, and/or other types of devices or equipment. The equipment 101 can include a device 110 and a user interface 130. The device 110 can be a microcontroller embedded in the equipment 101. The user interface 130 can be, for example, a human machine interface (HMI) including displays, control keys such as knobs, levers, switches, buttons, etc. For example, the user interface 130 shown in FIG. 1 can include buttons 131, 132, 133, 134. The device 110 can include integrated circuits, logic gates, processing units (e.g., microprocessors or other types pf processors), network cards or interfaces, etc. In the example shown FIG. 1, the device 110 can include at least two ports, such as a port 141 and a port 142. The port 141 and the port 142 can be interfaces or pins connected to traces or wires that can be extended to a sensor 140, where the sensor 140 can be can be a mutual capacitive sensor situated under a component of the user interface 130 (e.g., one of the buttons 131, 132, 133, 134).

In an example, the sensor 140 can include conductive elements, such as electrodes or metal traces (e.g. copper traces), such as a trace 144 and a trace 146. In some examples, the traces 144 and 146 can be printed traces on a printed circuit board (PCB). The trace 144 can be connected to the port 141 and the trace 146 can be connected to the port 142. In some examples, each one of the traces 144 and 146 can be an individual electrode, such as individual pieces of copper traces. The example in FIG. 1 shows the sensor 140 as a "C-shape" electrode. However, it will be apparent to a person of ordinary skill in the art that the sensor 140 can be other types of sensors or electrodes, such as a "2-shape" electrode, or electrodes of other shapes and dimensions. The device 110 can configure the port 141 and the port 142 to create or project an electric field between the traces 144 and 146 on the sensor 140. For example, the device 110 can configure each one of the port 141 and the port 142 to perform either a transmitting or a receiving function. The transmitting function can be, for example, an output of current to charge one of the traces 144 and 146 of the sensor 140, where the charged trace can form an electric field with the remaining trace among the traces 144 and 146. The receiving function can be, for example, being the recipient of the electric field formed between the traces 144 and 146. As a result of configuring one port to perform the transmitting function and another port to perform the receiving function, an electric field can be created or projected between the traces 144 and 146 of the sensor 140. In an example, the port 141 being configured to perform the transmitting function and the port 142 being configured to perform the receiving function can create a first electric field between the traces 144 and 146. Further, the port 142 being configured to perform the transmitting function and the port 141 being configured to perform the receiving function can create a second electric field between the traces 144 and 146, where the second electric field can be different from the first electric field. The initial mutual capacitance (e.g., mutual capacitance without interference from a touch event) associated with the first electric field and the second electric field can be different from one another.

In an example, a touch event 136 can occur on the user interface 130. For example, the touch event 136 can be pressing one of the buttons (e.g., button 132) on the user interface 130 using an object (e.g., fingertip, stylus, etc.). The object causing the touch event 136 can interfere with the electric field created on the sensor 140, and reduce a mutual capacitance between the traces that created the electric field. The mutual capacitance reduction can be detected by the device 110 and can be identified as a touch event. The device 110 can be configured to convert the detected mutual capacitance reduction into a measurement (e.g., analog to digital conversion) that can be processed by the processor 120.

In the example shown in FIG. 1, the sensor 140 can be situated underneath the button 132, and the touch event 136 can cause a first capacitance change on the sensor 140. The device 110 can detect the first capacitance change and convert the first capacitance change into a first measurement 111. The touch event 136 and the first capacitance change can occur under a first configuration of the port 141 and the port 142. The first configuration can be, for example, a configuration where the port 141 is the transmitting port and the port 142 is the receiving port, such that a first electric field is created by having electric forces directed from the trace 144 to the trace 146. In an example, the first capacitance change can also be detected between the port 141 and the port 142 under the first configuration. In response to detecting the first capacitance change, the device 110 can configure the port 141 and the port 142 from the first configuration to a second configuration. The second configuration can be, for example, a configuration where the port 141 is the receiving port and the port 142 is the transmitting port, such that a second electric field is created by having electric forces directed from the trace 146 to the trace 144. The device 110 can obtain a second capacitance change under the second configuration and convert the second capacitance change into the second measurement 112. The touch event 136 and the second capacitance change can occur under the second configuration of the port 141 and the port 142. In an example, the second capacitance change can also be detected between the port 141 and the port 142 under the second configuration. The first configuration and the second configuration can be different configurations where the transmitting port and the receiving port, or the transmitting trace and the receiving trace on the sensor 140, are swapped. The first capacitance change and the second capacitance change can be changes in mutual capacitance between the traces 144 and 146.

The device 110 can send the first measurement 111 and the second measurement 112 to the processor 120. The processor 120 can receive the first measurement 111 and the second measurement 112, and determine an anomaly likelihood 150 based on the first measurement 111 and the second measurement 112. In some examples, the processor 120 can be configured to store the first measurement 111 and the second measurement 112 in the memory 122. The anomaly likelihood 150 can be a likelihood of an occurrence of an anomaly on the user interface 130. In an example, the processor 120 can compare the first measurement 111 and the second measurement 112 to determine a difference between the first measurement 111 and the second measurement 112. The processor 120 can compare the difference with a predefined threshold that can be defined in the set of instructions 124 and stored in the memory 122.

In response to the difference being less than the predefined threshold, the processor 120 can determine that a presence of an anomaly is unlikely. In response to determining that a presence of an anomaly is unlikely, the processor 120 can output an indicator (e.g., visual indicator or audio indicator) representing the determined anomaly likelihood 150, and/or can maintain normal operation without outputting any indicator.

In response to the difference being greater than the predefined threshold, the processor 120 can determine that a presence of an anomaly is likely. In response to determining that a presence of anomaly is likely, the processor 120 can output an indicator (e.g., visual indicator or audio indicator) representing the determined anomaly likelihood 150 to notify a user of the equipment 101 that there may be an anomaly occurring on one or more parts of the equipment 101. In some examples, the processor 120 can be configured to push a notification representing the determined anomaly likelihood 150 to another processor or device. For example, the processor 120 can send or push the notification representing the determined anomaly likelihood 150 to a user device (e.g., mobile phone) of a user of the equipment, or can send or push the notification representing the determined anomaly likelihood 150 to a device managed by a manufacturer of the equipment 101, the device 110, the sensor 140, or the user interface, to notify the manufacture of a potential defect.

Figure 2:
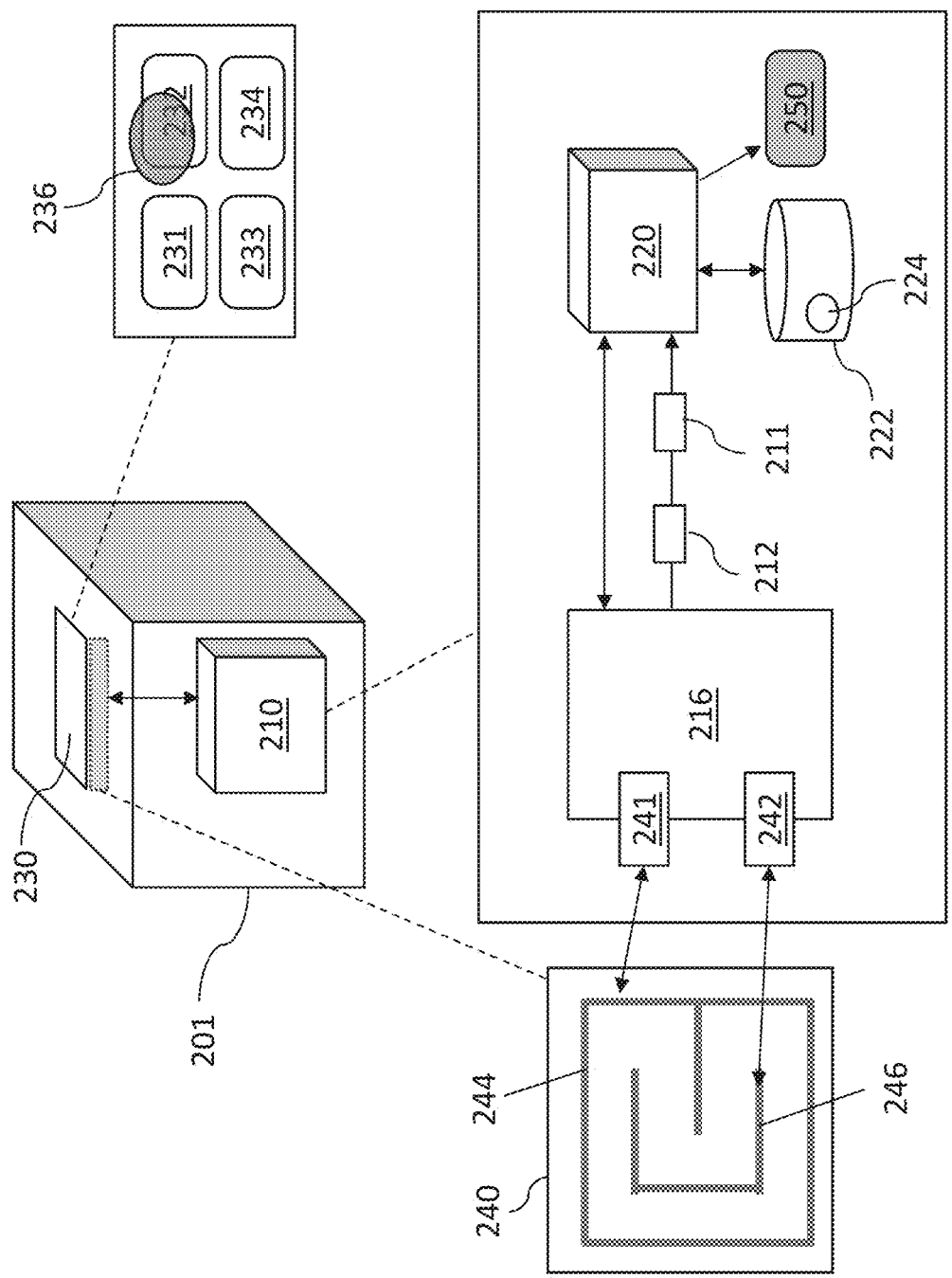
FIG. 2 is a diagram showing another example system that can implement mutual capacitive touch sensing anomaly detection in one embodiment.

FIG. 2 is a diagram showing another example system 200 that can implement mutual capacitive touch sensing anomaly detection in one embodiment. The system 200 can be implemented by an apparatus or a device 210, a user interface 230, and one or more sensors (e.g., a sensor 240). The equipment 201 can be, for example, an appliance, a white goods product, a healthcare device, and/or other types of devices or equipments. The equipment 201 can include the device 210, the user interface 230 and the one or more sensors. The device 210 can be a microcontroller embedded in the equipment 201. The user interface 230 can be, for example, a human machine interface (HMI) including displays, control keys such as knobs, levers, switches, buttons, etc. For example, the user interface 230 shown in FIG. 2 can include buttons 231, 232, 233, 234. The device 210 can include integrated circuits (e.g., an integrated circuit 216), logic gates, processing units (e.g., microprocessors or other types pf processors), network cards or interfaces, etc. In an example, the integrated circuit 216 can be an onboard peripheral device referred to as a capacitive touch sensing unit (CTSU). In the example shown FIG. 2, the integrated circuit 216 can include at least two ports, such as a port 241 and a port 242. The port 241 and the port 242 can be interfaces or pins connected to traces or wires that can be extended to the sensor 240, where the sensor 240 can be a mutual capacitive sensor situated under a component of the user interface 230 (e.g., one of the buttons 231, 232, 233, 234).

The device 210 can include a processor 220, a memory 222, and the integrated circuit 216. The processor 220 can be configured to be in communication with the memory 222. The processor 220 can be, for example, a processing unit such as a microprocessor or a programmable module, such as a field-programmable logic array (FPGA) module. In some examples, the memory 222 can be a local memory integrated in the processor 220. The memory 222 can be a memory device including memory units such as read-only memory (ROM), random access memory (RAM), registers, buffers, caches, etc. The memory 222 can be configured to store a set of instructions 224. The set of instructions 224 can include code, such as source code and/or executable code, that can be executed by the processor 220 to perform one or more tasks or functions to implement the system 200. In an example, the processor 220 can be configured to execute the set of instructions 224 to run one or more applications that can monitor the equipment 201, or that can perform various diagnostic tools on operating conditions or status of the equipment 201.

In an example, the sensor 240 can include one or more conductive elements, such as electrodes or metal traces (e.g., copper traces), such as a trace 244 and a trace 246. In some examples, the traces 244 and 246 can be printed traces on a printed circuit board (PCB). The trace 244 can be connected to the port 241 and the trace 246 can be connected to the port 242. In some examples, each one of the traces 244 and 246 can be an individual electrode. The example in FIG. 2 shows the sensor 240 as a "C-shape" electrode. However, it will be apparent to a person of ordinary skill in the art that the sensor 240 can be other types of sensors or electrodes, such as a "2-shape" electrode, or electrodes of other shapes and dimensions. The integrated circuit 216 can configure the port 241 and the port 242 to create or project an electric field between the traces 244 and 246 on the sensor 240. For example, the integrated circuit 216 can configure each one of the port 241 and the port 242 to perform either a transmitting or a receiving function. The transmitting function can be, for example, an output of current to charge one of the traces 244 and 246 of the sensor 240, where the charged trace can form an electric field with the remaining trace among the traces 144 and 146. The receiving function can be, for example, being the recipient of the electric field formed between the traces 244 and 246. As a result of configuring one port to perform the transmitting function and another port to perform the receiving function, an electric field can be created or projected between the traces 244 and 246 of the sensor 240. In an example, the port 241 being configured to perform the transmitting function and the port 242 being configured to perform the receiving function can create a first electric field between the traces 244 and 246. Further, the port 242 being configured to perform the transmitting function and the port 241 being configured to perform the receiving function can create a second electric field between the traces 244 and 246, where the second electric field can be different from the first electric field. The initial mutual capacitance (e.g., mutual capacitance without interference from a touch event) associated with the first electric field and the second electric field can be different from one another.

In an example, a touch event 236 can occur on the user interface 230. For example, the touch event 236 can be pressing one of the buttons (e.g., button 232) on the user interface 230 using an object (e.g., fingertip, stylus, etc.). The object causing the touch event 236 can interfere with the electric field created on the sensor 240, and reduce a mutual capacitance between the traces that created the electric field. The mutual capacitance reduction can be detected by the integrated circuit 216 and can be identified as a touch event. The integrated circuit 216 can be configured to convert the detected mutual capacitance reduction into a measurement (e.g., analog to digital conversion) that can be processed by the processor 220.

In the example shown in FIG. 2, the sensor 240 can be situated underneath the button 232, and the touch event 236 can cause a first capacitance change on the sensor 240. The integrated circuit 216 can detect the first capacitance change and convert the first capacitance change into a first measurement 211. The touch event 236 and the first capacitance change can occur under a first configuration of the port 241 and the port 242. The first configuration can be, for example, a configuration where the port 241 is the transmitting port and the port 242 is the receiving port, such that a first electric field is created by having electric forces directed from the trace 244 to the trace 246. In an example, the first capacitance change can also be detected between the port 241 and the port 242 under the first configuration. In response to detecting the first capacitance change, the integrated circuit 216 can configure the port 241 and the port 242 from the first configuration to a second configuration. The second configuration can be, for example, a configuration where the port 241 is the receiving port and the port 242 is the transmitting port, such that a second electric field is created by having electric forces directed from the trace 246 to the trace 244. In an example, the second capacitance change can also be detected between the port 241 and the port 242 under the second configuration. The integrated circuit 216 can obtain a second capacitance change under the second configuration and convert the second capacitance change into the second measurement 212. The touch event 236 and the second capacitance change can occur under the second configuration of the port 241 and the port 242. The first configuration and the second configuration can be different configurations where the transmitting port and the receiving port, or the transmitting trace and the receiving trace on the sensor 240, are swapped. The first capacitance change and the second capacitance change can be changes in mutual capacitance between the traces 244 and 246.

The integrated circuit 216 can send the first measurement 211 and the second measurement 212 to the processor 220. The processor 220 can receive the first measurement 211 and the second measurement 212, and determine an anomaly likelihood 250 based on the first measurement 211 and the second measurement 212. In some examples, the processor 220 can be configured to store the first measurement 211 and the second measurement 212 in the memory 222. The anomaly likelihood 250 can be a likelihood of an occurrence of an anomaly on the user interface 230. In an example, the processor 220 can compare the first measurement 211 and the second measurement 212 to determine a difference between the first measurement 211 and the second measurement 212. The processor 220 can compare the difference with a predefined threshold that can be defined in the set of instructions 224 and stored in the memory 222.

In response to the difference being less than the predefined threshold, the processor 220 can determine that a presence of an anomaly is unlikely. In response to determining that a presence of an anomaly is unlikely, the processor 220 can either output an indicator (e.g., visual indicator or audio indicator) representing the determined anomaly likelihood 250, and/or can maintain normal operation without outputting any indicator.

In response to the difference being greater than the predefined threshold, the processor 220 can determine that a presence of an anomaly is likely. In response to determining that a presence of an anomaly is likely, the processor 220 can output an indicator (e.g., visual indicator or audio indicator) representing the determined anomaly likelihood 250 to notify a user of the equipment 201 that there may be an anomaly occurring on one or more parts of the equipment 201. For example, the user interface 230 can include a light-emitting diode (LED), and the processor 220 can send a control signal to turn on the LED in response to determining an anomaly has likely occurred. In some examples, the processor 220 can be configured to push a notification representing the determined anomaly likelihood 250 to another processor or device. For example, the processor 220 can send or push the notification representing the determined anomaly likelihood 250 to a user device (e.g., mobile phone) of a user of the equipment, or can send or push the notification representing the determined anomaly likelihood 250 to a device managed by a manufacturer of the equipment 201, the device 210, the sensor 240, or the user interface, to notify the manufacture of a potential defect.

Figure 3A:
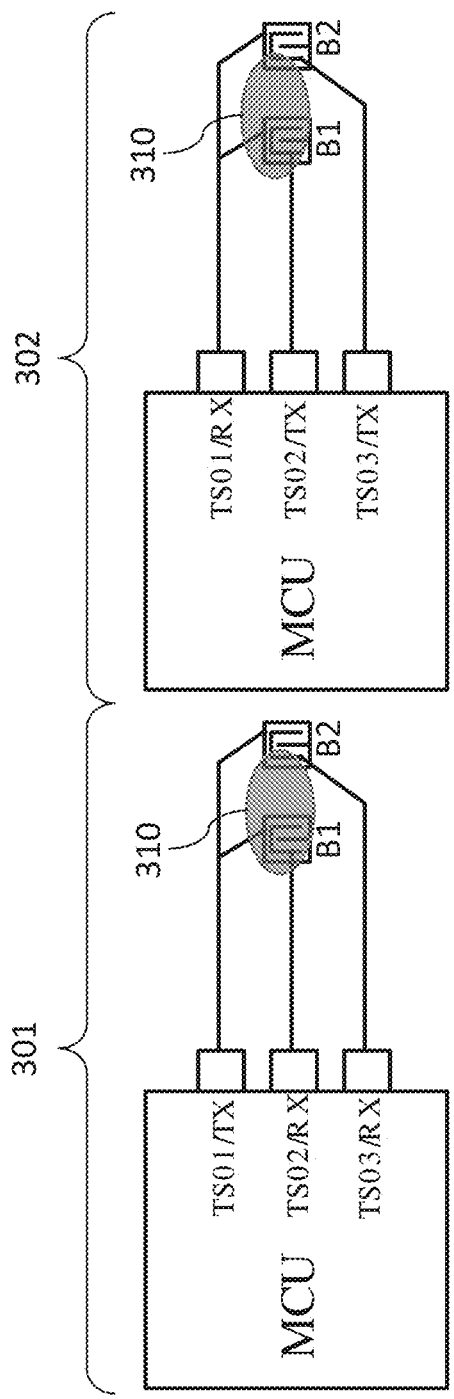
FIG. 3A is a diagram showing example configurations of a plurality of ports that can implement mutual capacitive touch sensing anomaly detection in one embodiment.

FIG. 3A is a diagram showing example configurations of a plurality of ports that can implement mutual capacitive touch sensing anomaly detection in one embodiment. In an example shown in FIG. 3A, a microcontroller unit (MCU) can include a plurality of ports TS01, TS02, TS03 that can be labeled as TX or RX. The MCU shown in FIG. 3A can be, for example, the device 110 or the device 210 shown in FIG. 1 or FIG. 2, respectively. A TX port can represent a port being configured to perform a transmitting function, such as supplying current provided by the MCU to charge a trace connected to the TX port of a sensor connected to a button. The trace connected to the TX port can be charged and can create an electric field with the a trace connected to a RX port on the sensor. The trace connected to the RX port on the sensor can be a recipient of the electric field created by the charged trace (e.g., the trace connected to the TX port). The RX port can return mutual capacitance changes between the charged trace and the recipient trace (trace connected to RX port) to the MCU, where the mutual capacitance changes can be measured from the recipient trace.

In a first configuration 301, the port TS01 can be assigned as a TX port, and the ports TS02 and TS03 can be assigned as RX ports. The first configuration 301 can be referred to as a matrix configuration representing a ratio of a number TX ports to a number of RX ports, such as a 1×2 matrix representing one TX port and two RX ports. The first configuration 301 can be a configuration for two physical sensors (e.g., mutual capacitive touch sensors) labeled as buttons B1 and B2.

In a second configuration 302, the port TS01 can be assigned as a RX port, and the ports TS02 and TS03 can be assigned as TX ports. The second configuration 302 can be referred to as another matrix configuration representing another ratio of a number TX ports to a number of RX ports, such as a 2×1 matrix representing two TX ports and one RX port. The second configuration 302 can be a configuration for the two physical sensors labeled as buttons B1 and B2

The arrangement and shape of the traces on each button B1 and B2 can cause a different electric field to be created between the first configuration 301 and the second configuration 302. Using the traces 144 and 146 shown in FIG. 1 as example traces for the buttons B1 and B2, in the first configuration 301, the trace 144 of B1, and the trace 144 of B2, can be charged in response to the port TS01 being configured as the TX port. In the first configuration 301, a first electric field having electric forces directed from the trace 144 to the trace 146 can be created for B1 and B2. In the second configuration 302, the trace 146 of B1, and the trace 146 of B2, can be charged in response to the ports TS02 and TS03 being configured as the TX port. In the second configuration 302, a second electric field having electric forces directed from the trace 146 to the trace 144 can be created for B1 and B2.

In an example, the MCU can configure the ports to be TX ports or RX ports by dynamically reconfiguring one or more driving pulses generated by the MCU. For example, the MCU can include a signal generator configured to generate a driving signal having periodic pulses, and this driving signal can be inputted to a driver or driver circuit connected to the TS01 port to configure the TS01 port as a TX port. In another example, the MCU can further include a current detector, and the MCU can switch the TS02 port to connect the TS02 port to the current detector to configure the TS02 port as a RX port. The MCU can configure each individual port to either connect to a driver or drive circuit to receive the driving signal, or to connect to a current detector to detect incoming current, in order to configure each port to be a TX port or a RX port, respectively. By being able to dynamically reconfigure the ports and take sequential measurements, in a back-to-back manner, from two different electric fields, a processor can use the sequential measurements to determine whether an anomaly is present or absent. In some examples, the MCU can configure the ports by using firmware or application programming interface (API) calls to configure the drivers or driver circuits being used to operate the MCU.

Figure 3B:
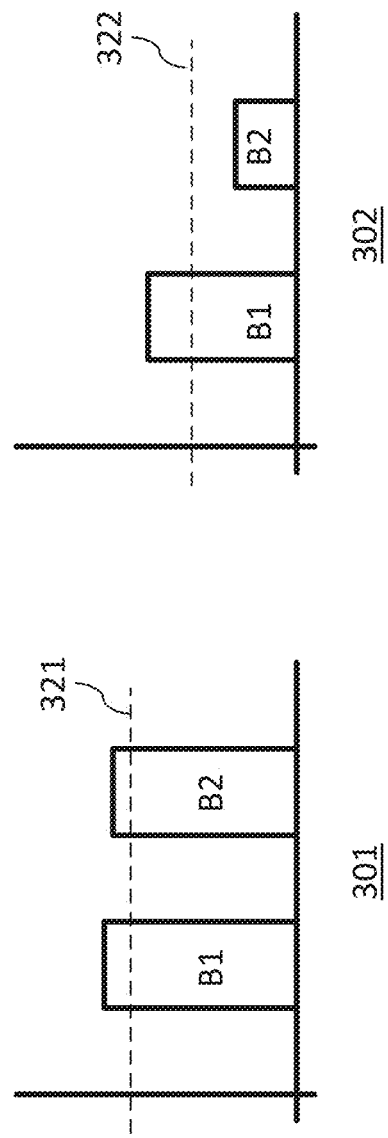
FIG. 3B is a diagram showing an example comparison of measurements resulted from an implementation of mutual capacitive touch sensing anomaly detection in one embodiment.

For example, FIG. 3B shows mutual capacitance changes of B1 and B2 under the first configuration 301 and the second configuration 302 in response to a touch event 310. The touch event 310 can be a touch event on the button B1, however, a portion of the button B2 is also touched unintentionally (e.g., object causing touch event 310 can be too large, or other objects such as water may have spread to button B2). Under the first configuration 301, the buttons B1 and B2 can be considered to have a touch event if their mutual capacitance change exceeds a touch threshold 321. Under the second configuration 302, the buttons B1 and B2 can be considered to have a touch event if their mutual capacitance change exceeds another touch threshold 322. The different touch thresholds 321 and 322 can be caused by the different electric fields (e.g., different direction of the electric forces) resulting from different TX and RX ports configured by the MCU. In the first configuration 301, the result can indicate that both buttons B1 and B2 are touched since both mutual capacitance change of B1 and B2 is greater than the touch threshold 321. However, this can be a false positive as the touch event is to press button B1 only. In the second configuration 302, the result indicates that only the capacitive button B1 exceeds the touch threshold 322. The discrepancy between the mutual capacitance changes under the first configuration 301 and the second configuration 302 can indicate that there can be an error or anomaly associated with the touch event 310. The discrepancy can be outputted (e.g., by the processors 120 or 220 shown in FIG. 1 or FIG. 2, respectively) as an anomaly likelihood (e.g., anomaly likelihood 150 or 250 in FIG. 1 or FIG. 2, respectively). For example, the discrepancy can be propagated as a detected hardware fault to an application layer of the equipment or device embedded with the mutual capacitive touch sensors.

An example anomaly on a device's user interface having mutual capacitive touch sensors can be an inability for the device to discern whether a particular button is being touched or selected in response to an environmental events, such as having water spanning across more than one button. The water laying across more than one button can potentially cause a false multi-touch event (e.g., pressing more than one button to input a command).

Another example anomaly can be broken connections or traces in the mutual capacitive touch sensors. By using different mutual capacitance change measurements resulting from different electric fields (e.g., swapping the direction of the electric field by swapping the transmitting and receiving ports) in response to a same touch event, the different mutual capacitance change measurements can be used as a confidence factor of whether the touch event is an anomaly or not. For instance, if two or more mutual capacitance change measurements are identical or very similar, then it may be unlikely that the touch event is an anomaly, or a presence of broken traces or connections may be unlikely. However, if the different mutual capacitance change measurements are significantly different, then it may be likely that the touch event is an anomaly, or a presence of broken traces or connections may be likely.

In an example embodiment, the methods and systems described herein can be employed for a subset of sensors or buttons on a device. For example, for an appliance such as a cooktop, buttons for temperature settings can be considered as critical as wrong temperature setting can sometimes create hazardous situations. Thus, the ports connected to these temperature setting buttons can employ the dynamic configuration of swapping ports described herein (e.g., via firmware and application programming interface (API) calls) to detect potential errors and anomalies. Therefore, applications that have a relatively large number of sensors or buttons can benefit from the methods and systems described herein by being able to have additional error detection schemes implemented without hardware changes and with limited software changes.

The systems and methods described herein can provide additional data and parameters (e.g., the measurement after swapping TX and RX ports) that can be used to monitor mutual capacitive touch sensors implemented in various types of devices and equipment. Further, by swapping TX and RX ports, additional hardware may not be needed to obtain the additional data for monitoring the sensors, thus avoiding a need for additional cost and additional board space for additional hardware.

Figure 4:
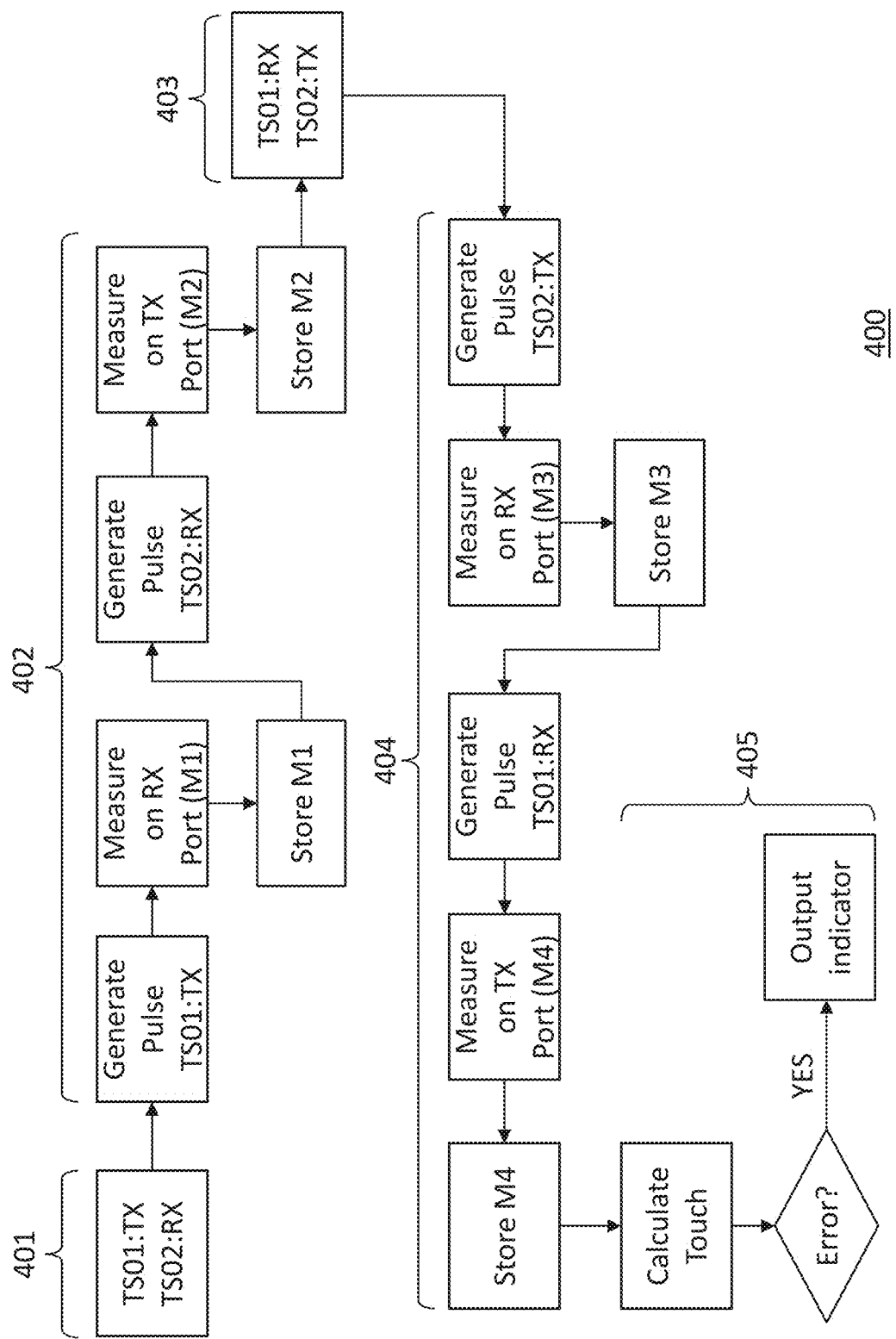
FIG. 4 is a flow diagram illustrating a process of implementing mutual capacitive touch sensing anomaly detection in one embodiment.

FIG. 4 is a flow diagram illustrating a process 400 of implementing mutual capacitive touch sensing anomaly detection in one embodiment. The process 400 can be implemented by a CTSU of a device. The process 400 can include a plurality of phases 401, 402, 403, 404, and 405. The phase 401 can be a first configuration phase to configure a port TS01 of the CTSU to be a transmitting (TX) port, and to configure a port TS02 to be a receiving (RX) port. In an example, the phase 401 can be a configuration phase to configure ports TS01 and TS02 shown in first configuration 301 of FIG. 3. The process 400 can proceed from the phase 401 to the phase 402.

The phase 402 can begin with generation of a transmit pulse. The transmit pulse can be sent to a first conductive structure (e.g., an electrode or trace) on a sensor (e.g., mutual capacitive touch sensor) connected to the TS01 port, where the port TS01 is configured as a TX port in the phase 401. The transmit pulse can drive current to charge the first conductive structure in order for an electric field to be created between the first conductive structure and a second conductive structure of the sensor. The second conductive structure can be connected to another port TS02 of the CTSU, where the port TS02 is configured as a RX port in the phase 401. The CTSU can measure current on the RX port TS02, where this measurement is labeled as M1. In an example, the CTSU can measure M1 by using a current mirror connected to a current controlled oscillator in the CTSU. The measurement M1 can be stored in a register (e.g., a part of the memory 122 or 222 shown in FIG. 1 or FIG. 2, respectively). The CTSU can further generate a receive pulse that can drive current to the second conductive structure on the sensor. The CTSU can perform another measurement on the TX port TS01, where this measurement is labeled as M2. The CTSU can store M2 in a register different from the register storing M1. Note the measurements M1 and M2 can be converted to digital data via a current controlled oscillator in the CTSU. The CTSU can combine the measurements M1 and M2 into a combined measurement (e.g., first measurement 111 or first measurement 211 in FIG. 1 or FIG. 2, respectively) and store the combined measurement in a register associated with the configuration from phase 401.

The process 400 can proceed from the phase 402 to the phase 403. The phase 403 can be a second configuration phase to configure the port TS01 of the CTSU to be the RX port, and to configure the port TS02 to be the TX port. In an example, the phase 403 can be a configuration phase to configure ports TS01 and TS02 shown in second configuration 302 of FIG. 3. The process 400 can proceed from the phase 403 to the phase 404.

The phase 404 is similar to the phase 402, with the TX and RX ports swapped. In the phase 404, the CTSU can generate a transmit pulse that can charge the second conductive structure connected to the TS02 port since the TS02 port is now the TX port. The CTSU can measure current on the RX port TS01, where this measurement is labeled as M3, and the measurement M3 can be stored in a register. The CTSU can further generate a receive pulse that can drive current to the first conductive structure on the sensor. The CTSU can perform another measurement on the TX port TS02, where this measurement is labeled as M4, and the CTSU can store M4 in a register different from the register storing M3. The CTSU can combine the measurements M3 and M4 into another combined measurement (e.g., second measurement 112 or second measurement 212 in FIG. 1 or FIG. 2, respectively) and stores the combined measurement of M3 and M4 in a register associated with the configuration from phase 403.

The process 400 can proceed from the phase 404 to the phase 405. In the phase 405, the CTSU or another processor (e.g., processor 120) can analyze the combined measurements to perform a calculation of touch events. For example, the results associated with the button B1 in FIG. 3B can be the results of the calculation of touch events in the phase 405. In response to a detection of an error or anomaly based on the calculation of touch events, the CTSU can output the result (e.g., anomaly likelihood 150 or 250 shown in FIG. 1 or FIG. 2, respectively) as one or more indicators.

In another example implementation of the phase 402, the generated transmit pulse in the phase 402 is for strobing the conductive structure of the sensor connected to the configured TX port at a specific rate (e.g., frequency of the transmit pulse) that can be predetermined by an external tuning program. This strobing is also mirrored on the other conductive structure of the sensor connected to the RX port using the receive pulse, which can be in-phase with the transmit pulse in the phase 402. The mirrored strobing on the other conductive structure connected to the RX port can draw a specific amount of current to charge and balance the conductive structure connected to the TX port. This drawn current can be used to drive a current controlled oscillator in the CTSU that can convert current to frequency pulses. The measurement M1 on the RX port can be frequency pulses outputted from the current controlled oscillator and counted by the CTSU over a fixed period of time, resulting in a parameter referred to as counts. After obtaining M1, the transmit pulse is driven out-of-phase and the same switching and measurement (e.g., measurement M2) is repeated again for this out-of-phase measurement (e.g., the transmit pulse and the receive pulse are out-of-phase for measurement M2). This opposing phase relationship of the two measurements M1 and M2 in the phase 402 allows parasitic capacitance to be removed from the resulting calculation. The implementation of the phase 404 utilizes the same scheme of strobing using in-phase signal, then subsequently, out-of-phase signal to obtain measurements M3 and M4.

In another example, the CTSU can be implemented with instructions (e.g., instructions 124 or 224 in FIG. 1 or FIG. 2, respectively) that can be divided into a plurality of layers, such as an abstraction layer, a driver layer that configures the drivers of the CTSU and performs scans or measurements, and a process layer that processes and categorizes the measurements into a touch event. The driver layer can include instructions to load a plurality of registers in sequence, where the sequence can define which ports of the CTSU are assigned as TX or RX ports and an order of performing various measurements and configurations. For example, under the phase 402, if only the TS01 and TS02 ports are configured, the driver layer can load the register in a sequence that takes a reading from the TS02 port prior to taking a reading from the TS01 port. This order where the TS02 port is read before the TS01 port can be an indication that the TS02 port is the RX port and the TS01 port is the TX port because the phase 402 measures the RX port before the TX port.

In another example, the instructions (e.g., instructions 124 and 224 shown in FIG. 1 or FIG. 2, respectively) to perform the methods described herein (e.g., process 400) can be encapsulated in an application programming interface (API). A user can interact with the CTSU via API calls and can obtain results from the API calls in the form of, for example, visual indicators (e.g., numbers, texts, graphs) showing a binary touch result (e.g., valid touch event or invalid touch event). For example, the instruction 124 or 224 shown in FIG. 1 or FIG. 2, respectively, can include API calls (inputted by users) to request a visual output of the measurement results from the process 400. In some examples, API calls can be made to start a touch scan and, upon completion, obtain a result that shows a graphical depiction of a presence or absence of a touch event (e.g., see FIG. 3B). Thus, the instructions 124 or 224 can facilitate measurement of two different configurations (with TX and RX ports swapped) and output results that can allow further analysis by an external processor that can be running diagnostic applications, such as categorizing a potential anomaly as different types of errors. The encapsulation of the instructions inside of an API can provide a portable and modular approach, allowing the instruction to be ported from application to application and MCU to MCU without refactoring.

FIG. 5 is a flow diagram illustrating a process 500 to implement mutual capacitive touch sensing anomaly detection in one embodiment. The process can include one or more operations, actions, or functions as illustrated by one or more of blocks 502, 504, and/or 506. Although illustrated as discrete blocks, various blocks can be divided into additional blocks, combined into fewer blocks, eliminated, or performed in parallel, depending on the desired implementation.

The process 500 can begin at block 502. At block 502, a processor can receive a first measurement of a first capacitance change between a first port and a second port of a device connected to a sensor. The first measurement can be obtained in response to the first port being configured to perform a first function, and in response to the second port being configured to perform a second function. In some examples, the processor can detect the first capacitance change between the first port and the second port of the sensor in response to the first port being configured to perform the first function, and in response to the second port being configured to perform the second function. The processor can further convert the first capacitance change into the first measurement. The processor can further configure the first port to perform the second function in response to detection of the first capacitance change. The processor can further configure the second port to perform the first function in response to detection of the first capacitance change.

The process 500 can proceed from block 502 to block 504. At block 504, the processor can receive a second measurement of a second capacitance change between the first port and the second port. The second measurement can be obtained in response to the first port being configured to perform the second function, and in response to the second port being configured to perform the first function. The processor can further detect the second capacitance change between the first port and the second port of the sensor in response to the first port being configured to perform the second function, and in response to the second port being configured to perform the first function. The processor can further convert the second capacitance change into the second measurement.

The process 500 can proceed from block 504 to block 506. At block 506, the processor can determine a likelihood of an occurrence of an anomaly in the sensor based on the first measurement and the second measurement. In some examples, the processor can determine a difference between the first measurement and the second measurement. The processor can further determine the likelihood of the occurrence of the anomaly based on the difference. In some examples, the processor can compare the difference with a threshold. In response to the difference being less than the threshold, the processor can determine that the occurrence of the anomaly in the sensor is unlikely. In response to the difference being greater than the threshold, the processor can determine that the occurrence of the anomaly in the sensor is likely. In some examples, the processor can output the likelihood of the occurrence of the anomaly on a display. In some examples, the processor can output the likelihood of the occurrence of the anomaly to another processor.

FIG. 6 illustrates a schematic of an example computer or processing system that may implement mutual capacitive touch sensing anomaly detection in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 6 may include, but are not limited to, personal computer systems, server computer systems, thin clients, thick clients, handheld or laptop devices, mobile or cellular phones including smartphones, wearable devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of a computer system may include, but are not limited to, one or more processors or processing units 12, a system memory 16, and a bus 14 that couples various system components including system memory 16 to processor 12. The processor 12 may include a module 30 (e.g., capacitive touch module 30) that performs the methods described herein. The module 30 may be programmed into the integrated circuits of the processor 12, or embedded or integrated into the integrated circuits of the processor 12, or loaded from the system memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus, and universal serial bus (USB).

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage device 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. Other examples of non-volatile memory or storage media can include, for example, flash memory, solid state drive (SSD), magnetoresistive random-access memory (MRAM), In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), WI-FI, Bluetooth, a cellular network (e.g., 3G, 4G, 5G, Long-Term Evolution (LTE)), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, flash memory, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, Java, C++, C#, Python, R, PHP, Visual Basic.NET, JavaScript, Ruby, Perl, Object Pascal, Objective-C, Dart, Swift, Scala, Kotlin, Common Lisp, MATLAB, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a processor configured to:
receive a first measurement of a first capacitance change between a first port and a second port, the first port and the second port being ports of a device connected to a sensor, the first measurement being obtained in response to the first port being configured to perform a first function, and in response to the second port being configured to perform a second function;
receive a second measurement of a second capacitance change between the first port and the second port, the second measurement being obtained in response to the first port being configured to perform the second function, and in response to the second port being configured to perform the first function; and
determine a likelihood of an occurrence of an anomaly in the sensor based on the first measurement and the second measurement.

2. The apparatus of claim 1,
wherein the processor is configured to:
determine a difference between the first measurement and the second measurement; and
determine the likelihood of the occurrence of the anomaly in the sensor based on the difference.

3. The apparatus of claim 2,
wherein the processor is configured to:
compare the difference with a threshold;
in response to the difference being less than the threshold, determine that the occurrence of the anomaly in the sensor is unlikely; and
in response to the difference being greater than the threshold, determine that the occurrence of the anomaly in the sensor is likely.

4. The apparatus of claim 1,
wherein the sensor is a mutual capacitive sensor.

5. The apparatus of claim 1, further comprising:
the sensor; and
the device connected to the sensor; and
wherein the device is configured to:
detect a first capacitance change between the first port and the second port in response to the first port being configured to perform the first function, and in response to the second port being configured to perform the second function;
convert the first capacitance change into the first measurement;
configure the first port to perform the second function in response to detection of the first capacitance change;
configure the second port to perform the first function in response to detection of the first capacitance change;
detect a second capacitance change between the first port and the second port in response to the first port being configured to perform the second function, and in response to the second port being configured to perform the first function; and
convert the second capacitance change into the second measurement.

6. The apparatus of claim 5,
wherein the device is configured to:
configure the first port to perform the first function in response to detection of the second capacitance change; and
configure the second port to perform the second function in response to detection of the second capacitance change.

7. The apparatus of claim 1 further comprising a display,
wherein the processor is configured to output the likelihood of the occurrence of the anomaly on the display.

8. The apparatus of claim 1,
wherein the processor is configured to output the likelihood of the occurrence of the anomaly to another processor.

9. The apparatus of claim 1,
wherein the processor is configured to output a visual indicator of the likelihood of the occurrence of the anomaly on a user interface of the sensor.

10. A method comprising:
receiving, by a processor, a first measurement of a first capacitance change between a first port and a second port of a device connected to a sensor, the first measurement being obtained in response to the first port being configured to perform a first function, and in response to the second port being configured to perform a second function;

receiving, by the processor, a second measurement of a second capacitance change between the first port and the second port, the second measurement being obtained in response to the first port being configured to perform the second function, and in response to the second port being configured to perform the first function; and determining, by the processor, a likelihood of an occurrence of an anomaly in the sensor based on the first measurement and the second measurement.

11. The method of claim 10,
wherein determining the likelihood of the occurrence of the anomaly in the sensor comprises:
  determining, by the processor, a difference between the first measurement and the second measurement; and
  determining, by the processor, the likelihood of the occurrence of the anomaly based on the difference.

12. The method of claim 11,
wherein determining the likelihood of the occurrence of the anomaly based on the difference comprises:
  comparing, by the processor, the difference with a threshold;
  in response to the difference being less than the threshold, determining, by the processor, that the occurrence of the anomaly in the sensor is unlikely; and
  in response to the difference being greater than the threshold, determining, by the processor, that the occurrence of the anomaly in the sensor is likely.

13. The method of claim 10, further comprising outputting, by the processor, the likelihood of the occurrence of the anomaly on a display.

14. The method of claim 10, further comprising outputting, by the processor, the likelihood of the occurrence of the anomaly to another processor.

15. The method of claim 10, further comprising:
  detecting, by the processor, the first capacitance change between the first port and the second port of the sensor in response to the first port being configured to perform the first function, and in response to the second port being configured to perform the second function;
  converting, by the processor, the first capacitance change into the first measurement;
  configuring, by the processor, the first port to perform the second function in response to detection of the first capacitance change;
  configuring, by the processor, the second port to perform the first function in response to detection of the first capacitance change;
  detecting, by the processor, the second capacitance change between the first port and the second port of the sensor in response to the first port being configured to perform the second function, and in response to the second port being configured to perform the first function; and
  converting, by the processor, the second capacitance change into the second measurement.

16. A non-transitory computer-readable storage medium storing instructions that cause a computer to at least perform:
  receiving a first measurement of a first capacitance change between a first port and a second port of a device connected to a sensor, the first measurement being obtained in response to the first port being configured to perform a first function, and in response to the second port being configured to perform a second function;
  receiving a second measurement of a second capacitance change between the first port and the second port of the device connected to the sensor, the second measurement being obtained in response to the first port being configured to perform the second function, and in response to the second port being configured to perform the first function; and
  determining a likelihood of an occurrence of an anomaly in the sensor based on the first measurement and the second measurement.

17. The non-transitory computer-readable storage medium of claim 16,
wherein determining the likelihood of the occurrence of the anomaly in the sensor comprises:
  determining a difference between the first measurement and the second measurement; and
  determining the likelihood of the occurrence of the anomaly based on the difference.

18. The non-transitory computer-readable storage medium of claim 17,
wherein determining the likelihood of the occurrence of the anomaly based on the difference comprises:
  comparing the difference with a threshold;
  in response to the difference being less than the threshold, determining that the occurrence of the anomaly in the sensor is unlikely; and
  in response to the difference being greater than the threshold, determining that the occurrence of the anomaly in the sensor is likely.

19. The non-transitory computer-readable storage medium of claim 16,
wherein the instructions further cause the computer to perform:
  outputting the likelihood of the occurrence of the anomaly on a display.

20. The non-transitory computer-readable storage medium of claim 16,
wherein the instructions further cause the computer to perform:
  outputting the likelihood of the occurrence of the anomaly to another processor.

* * * * *